United States Patent [19]
Cain et al.

[11] Patent Number: 5,922,100
[45] Date of Patent: *Jul. 13, 1999

[54] PRECISION BURNERS FOR OXIDIZING HALIDE-FREE SILICON-CONTAINING COMPOUNDS

[75] Inventors: Michael B. Cain; Robert B. Desorice, both of Corning; William J. Kiefer, Horseheads; Dale R. Powers, Painted Post, all of N.Y.

[73] Assignee: Corning Incorporated, Corning, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/729,305

[22] Filed: Oct. 15, 1996

Related U.S. Application Data

[62] Division of application No. 08/367,047, Dec. 30, 1994, Pat. No. 5,599,371.

[51] Int. Cl.[6] .................................................. C03B 37/018
[52] U.S. Cl. ............................... 65/531; 65/17.4; 65/144; 118/724; 239/422; 239/424; 239/424.5
[58] Field of Search ........................... 65/531, 17.4, 144, 65/413, 421; 239/422, 424, 424.5; 118/724

[56] References Cited

U.S. PATENT DOCUMENTS

| | | | |
|---|---|---|---|
| 3,565,345 | 2/1971 | Herbert | 239/422 |
| 3,642,521 | 2/1972 | Moltzan et al. | 117/105.2 |
| 3,698,936 | 10/1972 | Moltzan | 117/105.2 |
| 4,165,223 | 8/1979 | Powers | 65/2 |
| 4,314,837 | 2/1982 | Blankenship | 65/421 |
| 4,406,684 | 9/1983 | Kawachi et al. | 65/157 |
| 4,474,593 | 10/1984 | Andrejco et al. | 65/3.12 |
| 4,801,322 | 1/1989 | Suda et al. | 65/144 |
| 4,915,717 | 4/1990 | Watanabe et al. | 65/3.12 |
| 5,043,002 | 8/1991 | Dobbins et al. | 65/3.12 |
| 5,110,335 | 5/1992 | Miller | 65/413 |
| 5,356,451 | 10/1994 | Cain et al. | 65/414 |
| 5,599,371 | 2/1997 | Cain | 65/531 |
| 5,702,495 | 12/1997 | Hiraiwa | 65/531 |

FOREIGN PATENT DOCUMENTS

| | | | |
|---|---|---|---|
| 54-30853 | 3/1979 | Japan | 65/531 |

OTHER PUBLICATIONS

Technical Hydraulic Handbook (The Lee Company Technical Center) (1989).

*Primary Examiner*—John Hoffmann
*Attorney, Agent, or Firm*—Edward F. Murphy

[57] ABSTRACT

A precision burner for oxidizing halide-free, silicon-containing compounds, such as, octamethylcyclotetrasiloxane (OMCTS), is provided. The burner includes a subassembly (13) which can be precisely mounted on a burner mounting block (107) through the use of an alignment stub (158), a raised face (162) on the burner mounting block (107), and a recess (160) in the back of the subassembly (13). The burner's face includes four concentric gas-emitting regions: a first central region (36, 90) from which exits a mixture of OMCTS and $O_2$, a second innershield region (38, 92) from which exits $N_2$, a third outershield region (40, 42, 94, 96) from which exits $O_2$, and a fourth premix region (44, 98) from which exits a mixture of $CH_4$ and $O_2$. The burner provides more efficient utilization of halide-free, silicon-containing raw materials than prior burners.

9 Claims, 4 Drawing Sheets

PRECISION BURNERS FOR OXIDIZING HALIDE-FREE SILICON-CONTAINING COMPOUNDS

This is a division of application Ser. No. 08/367,047 filed Dec. 30, 1994 now U.S. Pat. No. 5,599,371.

FIELD OF THE INVENTION

This invention relates to burners for use in producing preforms which can be used to produce optical or acoustic waveguide fibers either directly or through intermediate production of core cane.

BACKGROUND OF THE INVENTION

Historically, halide-containing raw materials, such as, $SiCl_4$ or mixtures of $SiCl_4$ with various dopants, have been used in the manufacture of preforms by vapor phase deposition techniques, such as, the VAD (vapor axial deposition) and OVD (outside vapor deposition) techniques.

In these procedures, the halide-containing raw materials are volatilized and then hydrolyzed in a burner to produce soot particles which are collected on a rotating starting rod (bait tube) in the case of VAD or a rotating mandrel in the case of OVD. In some OVD systems, the cladding portion of the preform is deposited on a previously-formed core preform, rather than on a mandrel.

Numerous burner designs have been developed for use in such processes, examples of which can be found in Moltzan et al., U.S. Pat. Nos. 3,642,521, Powers, 4,165,223, Moltzan, 3,565,345, and Moltzan, 3,698,936.

In particular, Suda et al., U.S. Pat. No. 4,801,322, discuss the problem of soot particles adhering to the orifices of a burner (see column 12, lines 55–66) Kawachi et al., U.S. Pat. Nos. 4,406,684, and Watanabe et al., 4,915,717, disclose burners in which an outlet for a raw material is surrounded by an outlet for an inert gas; and Andrejco et al., U.S. Pat. No. 4,474,593, disclose a burner employing concentric tubes, some of which have machined splines on their outer surfaces.

The use of halide-containing raw materials generates substantial quantities of halide-containing by-products, e.g., hydrochloric acid. To avoid environmental pollution, these by-products must be collected, which increases the overall cost of the preform production process. Accordingly, halide-free materials and, in particular, halide-free, silicon-containing materials are desirable starting materials for the production of preforms. See Dobbins et al., U.S. Pat. No. 5,043,002.

As explained in the Dobbins et al. patent, the relevant portions of which are incorporated herein by reference, particularly preferred halide-free, silicon-containing materials for use in producing preforms are polymethylsiloxanes, with the polymethylcyciosiloxanes being particularly preferred, and with octamethylcyclotetrasiloxane (OMCTS) being especially preferred. These same halide-free, silicon-containing raw materials are preferred for use with the present invention.

Although conventional burners can be used to oxidize halide-free, silicon-containing materials, such burners, having been designed for use with halide-containing raw materials, do not achieve particularly efficient utilization of halide-free materials. These deficits arise both from the burner's construction and from the exit locations at the burner's face of the various gases used in the oxidization process. As discussed in detail below, in accordance with the present invention, gas flow patterns and burner configurations have been developed which eliminate these deficits.

In the OVD process, preforms can be made by traversing a single burner along the entire length of the preform or by using a series of burners mounted on an oscillating manifold, with each burner traversing only a portion of the preform. In the latter case, the uniformity of the burners relative to one another determines the longitudinal uniformity of the preform.

Prior art burners have often exhibited substantial variability in their properties which, in turn, has resulted in an undesirable level of variability in preforms produced using such burners in an oscillating manifold. As detailed below, as a further aspect of the invention, burner configurations have been developed which minimize this burner variation.

SUMMARY OF THE INVENTION

In view of the foregoing, it is an object of the present invention to provide burners which will effectively and efficiently oxidize halide-free, silicon-containing raw materials, such as OMCTS.

It is a further object of the invention to provide a burner construction which allows the burner to be assembled from its component parts and to be mounted on a manifold with a low degree of variability, i.e., to provide a high precision burner.

To achieve the foregoing and other objects, the invention in accordance with certain of its aspects provides a method for forming a preform comprising:

(a) providing an elongated cylindrical starting member, e.g., a rotating mandrel or a core preform;

(b) providing a soot-producing burner (10, 100) having a burner face (34, 88) that comprises first (36, 90), second (38, 92), third (40, 42, 94, 96), and fourth (44, 98) gas-emitting regions, the second region surrounding the first region, the third region surrounding the second region, and the fourth region surrounding the third region;

(c) providing a mixture comprising oxygen and a halide-free, silicon-containing material, e.g., OMCTS, to the first region;

(d) providing an inert gas, e.g., $N_2$, to the second region in an amount sufficient to inhibit the burner's soot stream from touching down on the burner's face;

(e) providing oxygen to the third region;

(f) providing a mixture comprising oxygen and a combustible gas, e.g., $CH_4$, to the fourth region; and (g) depositing glass soot on the starting member to form the preform by producing relative oscillatory motion between the soot-producing burner and the starting member.

In accordance with others of its aspects, the invention provides a soot-producing burner comprising:

(a) a burner subassembly (13) which comprises:

a back block (106) having a plurality of gas-carrying passages (112, 114, 116, 126, 128, 130), a face block (102) having a central gas-carrying passage (184) and a plurality of gas-carrying passages (186, 188) surrounding the central gas-carrying passage (note that as seen from the burner's face, the central passage is bore 90; however, this bore is formed in fume tube 108, rather than in face block 102), a manifold plate (104) between the back block (106) and the face block (102), which includes a plurality of orifices (170, 172) for providing circumferential equalization of the pressure of gas flowing through the plurality of gas-carrying passages (186, 188) surrounding the central gas-carrying passage (184) of the face block (102), and means (105, 150, 152, 154, 156) for forming an assembly (13) of the face block (102), back block (106), and manifold plate (104);

(b) a burner subassembly mounting block (107) for attachment to a gas-supplying manifold; and (c) means (140, 142, 144, 158, 160, 162) for precisely mounting the burner subassembly 13 on the burner subassembly mounting block (107).

In certain preferred embodiments, the burner includes a fume tube (108) having an integral manifold (110) which includes a plurality of orifices (168) for providing circumferential equalization of the pressure of gas flowing through central gas-carrying passage (184) of the face block (102). In other preferred embodiments, the manifold plate (104) includes a flange (105) for providing a precise alignment between the face block (102), back block (106), and manifold plate (104) in the assembled burner.

The foregoing drawings, which are incorporated in and constitute part of the specification, illustrate the preferred embodiments of the invention, and together with the description, serve to explain the principles of the invention. It is to be understood, of course, that both the drawings and the description are explanatory only and are not restrictive of the invention.

DESCRIPTION OF THE PREFERRED EMBODIMENTS

As discussed above, one of the aspects of the present invention is the arrangement of the various gas flows at the burner face. Such gas flows can be implemented using a prior art burner construction or preferably using the improved burner constructions disclosed herein.

Figure 1:
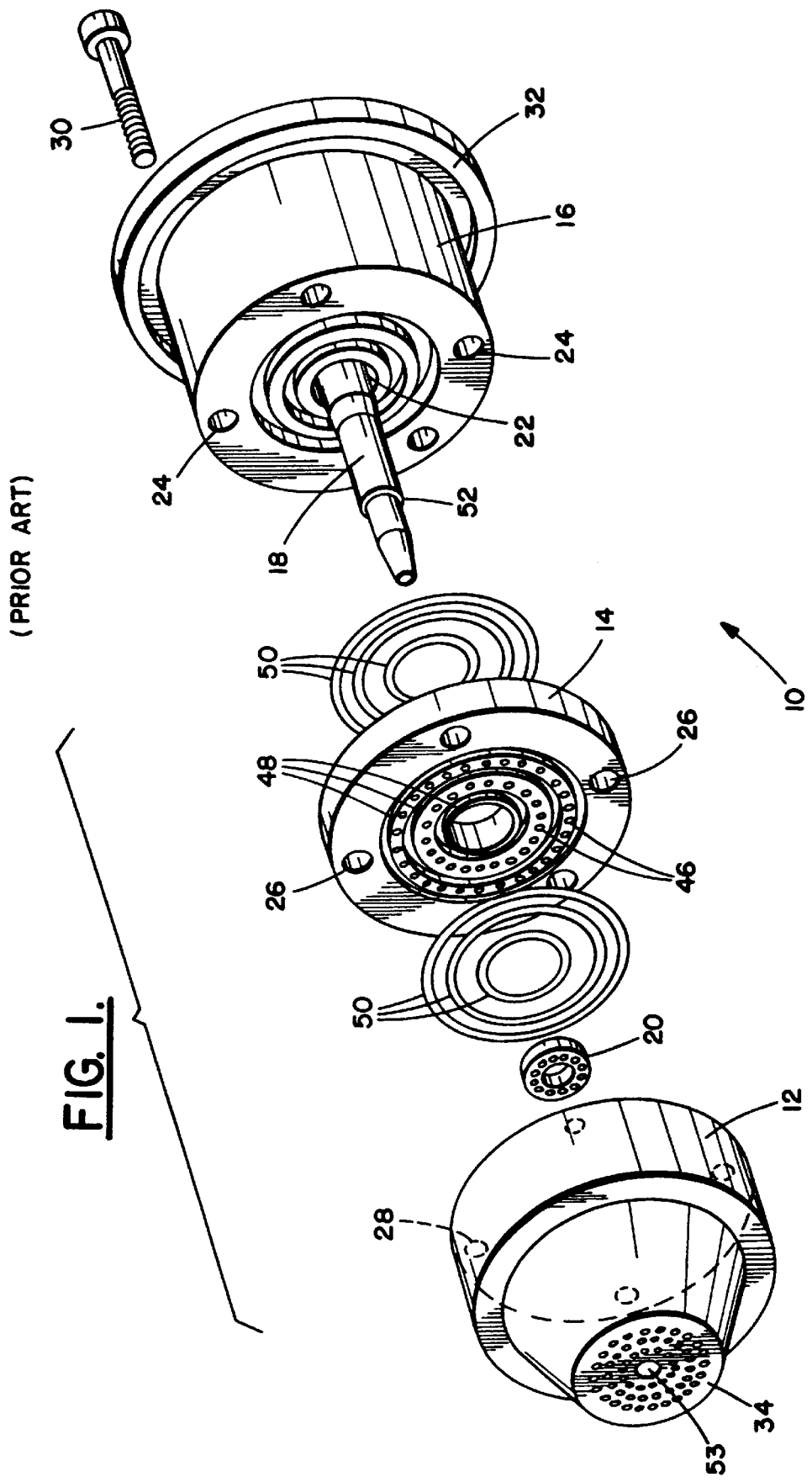
FIG. 1 is an exploded view of a prior art burner.

FIG. 1 shows a prior art burner 10 of the type previously used in the OVD process to produce preforms. Burner 10 includes face block 12, manifold plate 14, back block 16, fume tube 18, and inner shield manifold 20. Manifold plate 14 includes annularly arranged orifices 46 for providing uniform gas flows at burner face 34. O-rings 50 are received in grooves 48 of manifold plate 14 and serve to prevent gas leakage between the various passages of the burner. Fume tube 18, which is threaded at its rear end, extends through back block 16 and carries inner shield manifold 20 at its leading end. In particular, in the assembled burner, inner shield manifold 20 abuts shoulder 52 of fume tube 18.

Burner 10 is assembled by screwing fume tube 18 into the back of central aperture 22 of back block 16, the rear portion of the aperture being threaded for this purpose, inserting O-rings 50 in grooves 48 of manifold plate 14, passing the manifold plate over the leading end of the fume tube and aligning bolt holes 26 in the plate with bolt holes 24 in the back block, sliding inner shield manifold 20 onto the fume tube, and passing face block 12 over the leading end of the fume tube and aligning its bolt holes 28 with bolt holes 26. Bolts 30, only one of which is shown in FIG. 1, are then inserted through aligned bolt holes 24, 26, and 28, and tightened to hold burner 10 together. The assembled burner is then mounted on a gas-supplying manifold, e.g., a multi-burner, oscillating manifold, by means of mounting flange 32 on back block 16. The gas-supplying manifold provides the various gases used by the burner by means of gas supply lines and gas tight fittings which mate with gas-receiving apertures (not shown) in the back surface of back block 16.

In practice, it has been found that the positioning of inner shield manifold 20 on fume tube 18 and the alignment of face block 12, manifold plate 14, back block 16, and fume tube 18 has varied from burner to burner. Also, the use of flanges 32 to mount a series of burners on a multi-burner, gas-supplying manifold has resulted in variations in the locations of the burners relative to the axis of the preform being produced. Both of these variations are addressed by precision burner 100 shown in FIGS. 5–7 and discussed below.

Figure 3:
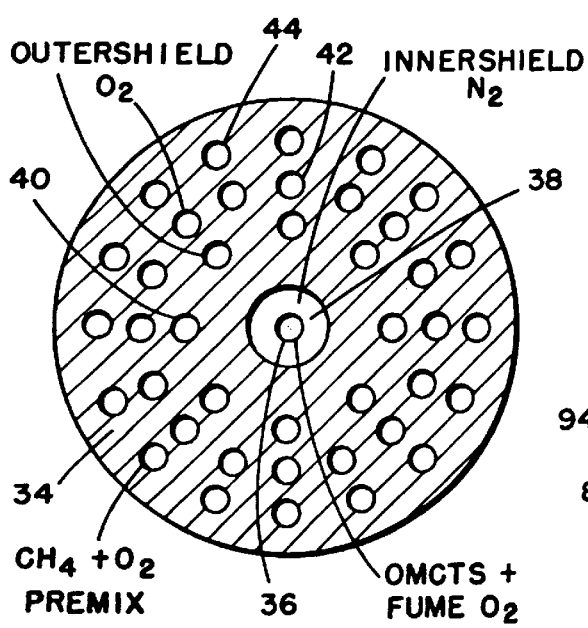
FIG. 3 is a plan view of the burner face of the burner of FIG. 1. The indicated gas flows on this figure are those of the present invention.

FIG. 3 is a plan view of face 34 of burner 10. As can be seen in this view, the burner face contains a series of annular regions 36 through 44 through which the various gases and gas mixtures used in producing soot particles pass. Region 36 comprises the bore of fume tube 18, while region 38 comprises the space between the fume tube and the central bore 53 of face block 12. The remaining regions 40, 42, and 44 are each composed of multiple orifices, although continuous open rings, like that of region 38, can be used for these regions in the practice of the invention, if desired. Fume tube 18 can be recessed behind face 34 of face block 12 by, for example, about 2 millimeters.

When used in prior art processes employing halide-containing raw materials, regions 36 through 44 carried the following gases:

TABLE 1

| | |
|---|---|
| region 36 | halide containing raw material/inert gas mixture |
| region 38 | oxygen |
| region 40 | combustible gas/oxygen mixture |
| region 42 | combustible gas/oxygen mixture |
| region 44 | oxygen |

In accordance with the invention, it has been found that the regions should carry the following gases when halide-free, silicon-containing materials, such as OMCTS, are to be oxidized:

TABLE 2

| | |
|---|---|
| region 36 | halide-free, silicon-containing raw material/oxygen mixture plus, optionally, inert gas |
| region 38 | inert gas, e.g., nitrogen and/or argon |
| region 40 | oxygen |
| region 42 | oxygen |
| region 44 | combustible gas/oxygen mixture |

This arrangement of gas flows is shown in FIG. 3 for a system in which the halide-free, silicon-containing raw material is OMCTS, the inert gas is nitrogen, and the combustible gas is methane ($CH_4$).

Figure 2:
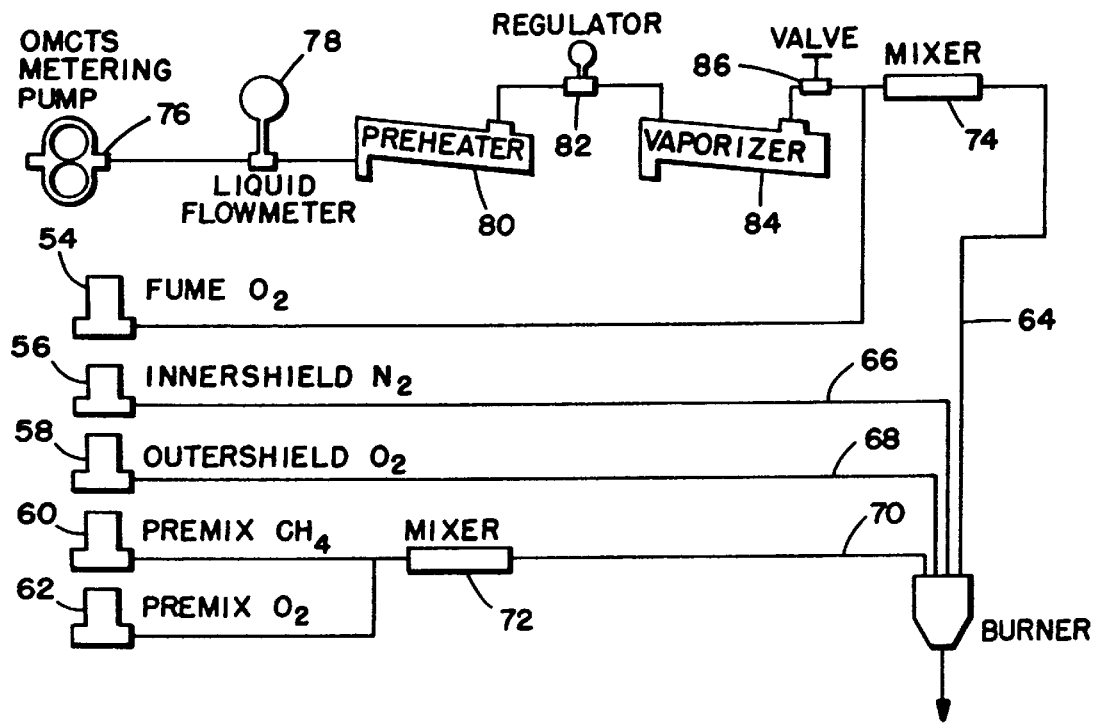
FIG. 2 is a schematic diagram of a gas delivery system for use in the practice of the present invention.

FIG. 2 schematically illustrates a delivery system for these gases comprising regulated gas sources 54 through 62, burner feed lines 64 through 70, gas mixers 72 and 74, and metering pump 76, flowmeter 78, preheater 80, regulator 82, vaporizer 84, and valve 86 for vaporizing and dispensing OMCTS. Various equipment known to those skilled in the art can be used in the construction of the delivery system of FIG. 2. For example, Cain et al., U.S. Pat. No. 5,356,451, discloses suitable equipment for use in vaporizing and dispensing OMCTS. Other equipment and delivery systems can, of course, be used in the practice of the invention.

Figure 4:
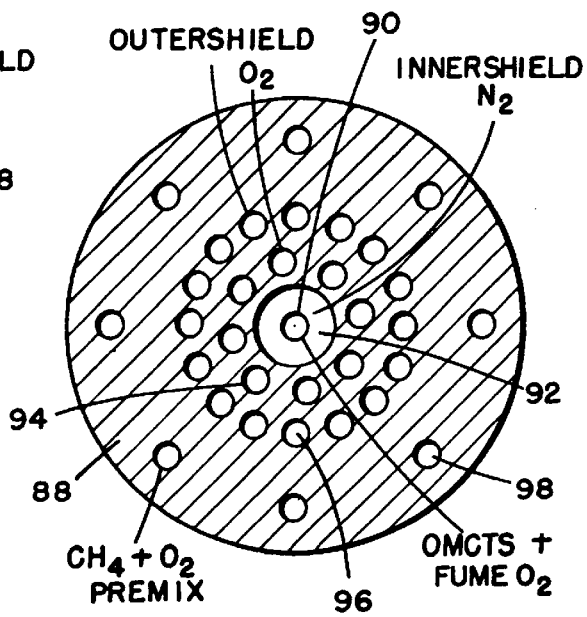
FIG. 4 is a plan view of a burner face constructed in accordance with the present invention. As in FIG. 3, the gas flows shown are those of the present invention.

In both FIGS. 2 and 3, as well as in FIG. 4, "fume" designates oxygen supplied to region 36, "innershield" designates nitrogen supplied to region 38, "outershield" designates oxygen supplied to regions 40 and 42, and "premix" designates the methane/oxygen mixture supplied to region 44. Note that regions 40 and 42 can be considered subregions of a single region since they carry the same gas.

The gas flow pattern shown in FIG. 3 and set forth above in Table 2 provides for more efficient utilization of halide-free, silicon-containing raw materials, such as OMCTS, than that achieved with the prior art pattern of Table 1. In particular, in accordance with the invention, it has been determined that compounds such as OMCTS require a large amount of oxygen to completely react and little external heat since the compound contains a large amount of fuel in its own composition.

The use of regions 40 and 42 to supply oxygen, rather than a combustible gas/oxygen mixture, as in the gas flow pattern of Table 1, provides a high volume of oxygen at a position close to the fume tube sufficient to fully react OMCTS and similar compounds. Moreover, limiting the combustible gas/oxygen mixture to region 44 has been found to provide sufficient external heat for the oxidation process, while at the same time reducing the amount of combustible gas required for preform production.

Significantly, it has been found that oxygen needs to be removed from region 38, i.e., the innershield, when oxidizing halide-free compounds such as OMCTS. If oxygen is used in this region, the soot stream has a tendency to touch down on the burner face and deposit silica around fume tube 18. Passing an inert gas, such as nitrogen, through the innershield moves the reaction between the halide-free compound and oxygen to a point sufficiently far from the burner face to prevent soot deposition on the fume tube.

Preferred feed/flow rates for the various materials/gases of Table 2 are as follows for the burner construction of FIG. 1 and the burner face configuration of FIG. 3: OMCTS—13 grams/minute; fume $O_2$—5 slpm (standard liters per minute); fume $N_2$ (optional)—0.4 slpm; innershield $N_2$—3.8 slpm; outershield $O_2$—7 slpm; premix $CH_4$—3.5 slpm; and premix $O_2$—2.8 slpm.

In practice, it has been found that deposition rate and collection efficiency are most dependent upon OMCTS feed rate, fume $O_2$ flowrate, and target diameter, while soot preform density is most dependent upon total oxygen content (fume $O_2$ flowrate and outershield $O_2$ flowrate), target diameter, and burner to target distance. These parameters can thus be varied to optimize deposition rate, collection efficiency, and preform density using process control procedures known to persons skilled in the art.

The lack of a significant dependence of soot density on OMCTS feed rate means that soot density can be controlled independently of deposition rate. Specifically, soot density can be optimized to achieve a constant radial density profile and then the deposition rate can be optimized using the OMCTS feed rate without disturbing the constant radial density profile. In terms of commercial production, this is an important advantage of the gas flow patterns of the present invention.

FIG. 4 illustrates an improved burner face construction for use in oxidizing halide-free, silicon containing raw materials. A comparison of FIGS. 3 and 4 reveals the following differences between burner face 88 of FIG. 4 and burner face 34 of FIG. 3:

(1) The number of orifices in region 98 of burner face 88 is half the number of region 44 of burner face 34. This causes the $CH_4+O_2$ premix flame to extend further away from the burner face and thus be more stable and less prone to flash back. It also results in a significant reduction in the burner's operating temperature (e.g., from about 350–400° C. to about 200–250° C.), which, in turn, results in a significantly longer life for the burner's O-ring seals.

(2) Regions 94 and 96 of burner face 88 are closer to region 92 than the corresponding regions of face 34 so as to reduce the diffusion distance for oxygen from outershield regions 94 and 96 to fume tube region 90. Preferred diameters for regions 94, 96, and 98 are 7.9, 11.9, and 17.0 mm, respectively, while those for regions 40, 42, and 44 are 8.4, 13.5, and 18.0 mm, respectively. If the diameters of regions 94, 96, and 98 are designated $D_i$, $D_o$, and $D_4$, respectively, then it can be seen in FIG. 4 that $D_4-D_o$ is greater than $D_o-D_i$.

In addition to the foregoing changes, the focus angle, i.e., the angle which the centerline of an orifice makes with a normal to the face of the burner, was increased from 13° for the orifices of burner face 34 to 16° for the orifices of face 88. Also, while the orifices of regions 40, 42, and 44 of burner face 34 are all of the same size (e.g., 0.09 mm), the orifices of regions 94 and 96 of burner face 88 are approximately ⅓ larger than the orifices of region 98 (e.g., 0.12 mm for regions 94 and 96 versus 0.09 mm for region 98). This increase in diameter reduces the velocity of the oxygen exiting these regions and thus keeps the oxygen flows from tearing the flame apart. Further, the diameter of region 92 is somewhat smaller than the diameter of region 38 (e.g., 4.1 mm diameter for region 92 versus 4.6 mm diameter for region 38) so as to reduce to some extent the flow of innershield nitrogen.

Preferred feed/flow rates for the various materials/gases of Table 2 are as follows for the burner construction of FIG. 1 and the burner face configuration of FIG. 4: OMCTS—12.5 grams/minute (region 90); fume $O_2$—5.5 slpm (region 90); fume $N_2$ (optional)—0.0 slpm (region 90); innershield $N_2$—3.2 slpm (region 92); outershield $O_2$—9.9 slpm (regions 94 and 96); premix $CH_4$—3.5 slpm (region 98); and premix $O_2$— 2.8 slpm (region 98).

Deposition rate, collection efficiency, and soot preform density were found to depend upon the same parameters discussed above in connection with burner face 34, although the dependence of deposition rate and collection efficiency on OMCTS feed rate for burner face 88 was about half that of burner face 34 and burner to target distance was found to play a more important role in deposition rate and collection efficiency for burner face 88. As with burner face 34, soot density did not show a significant dependence on OMCTS feed rate for burner face 88, thus allowing soot density to be controlled independently of deposition rate.

Testing of burner face 88 showed that it provided a dramatic increase in deposition rate for small target sizes in comparison to the rate achieved with burner face 34, i.e., a 70% increase at a 7 mm target size (diameter). The amount of increase was less as the target size increased, but was still significant, i.e., at a target size of 54 mm, the increase was estimated to be about 35%. Overall, the average deposition rate increase was approximately 25% for a target that was 0.7 meters long and had an initial diameter of 7 mm, i.e., 5.94 gm/minute for burner face 34 versus 7.41 gm/minute for burner face 88 for a fixed density of 0.6 gm/cm$^3$. Significantly, the increase in deposition rate was achieved without a loss in preform density.

Figure 5:
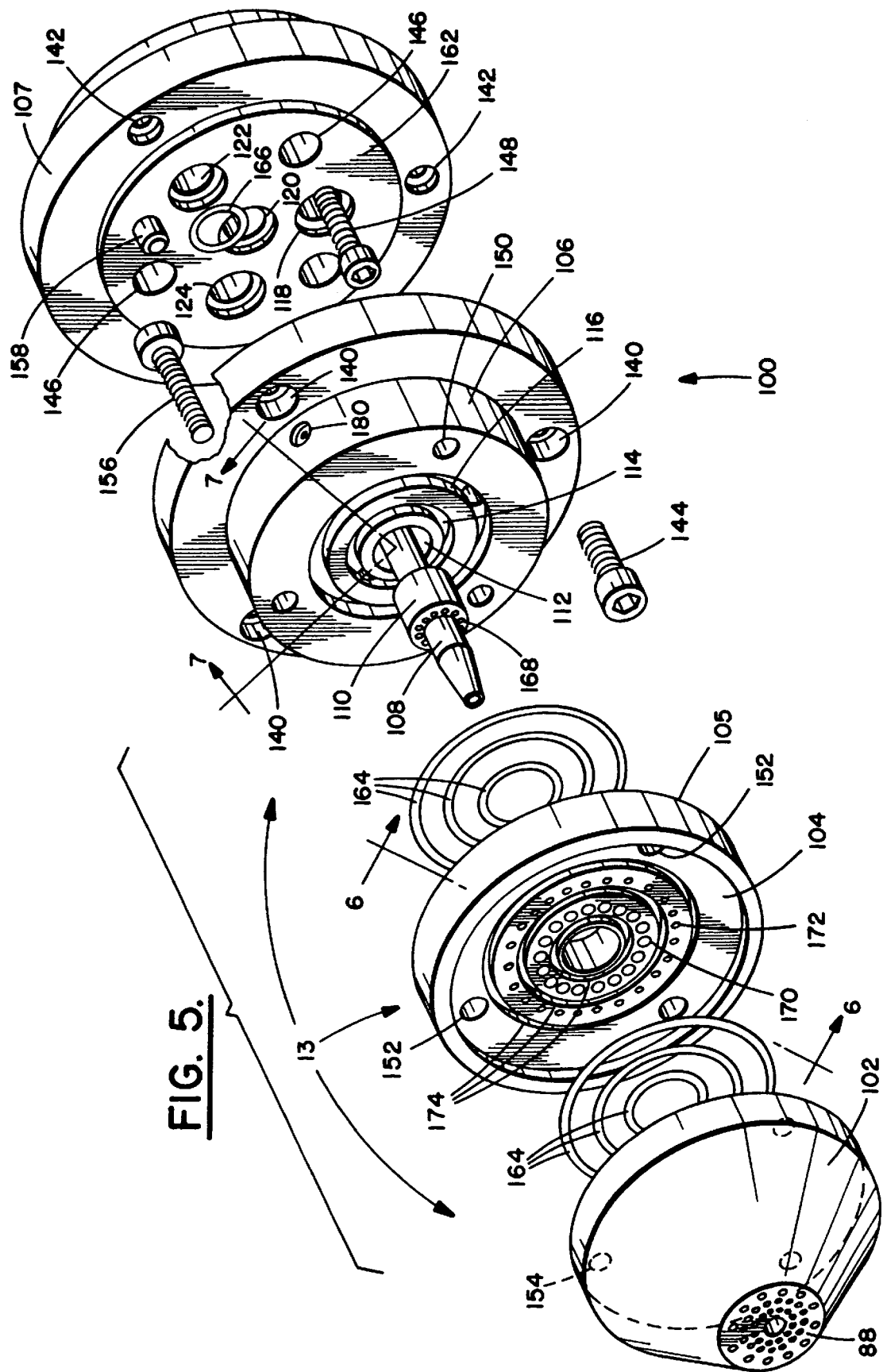
FIG. 5 is an exploded view of a precision burner constructed in accordance with the present invention.
Figure 6:
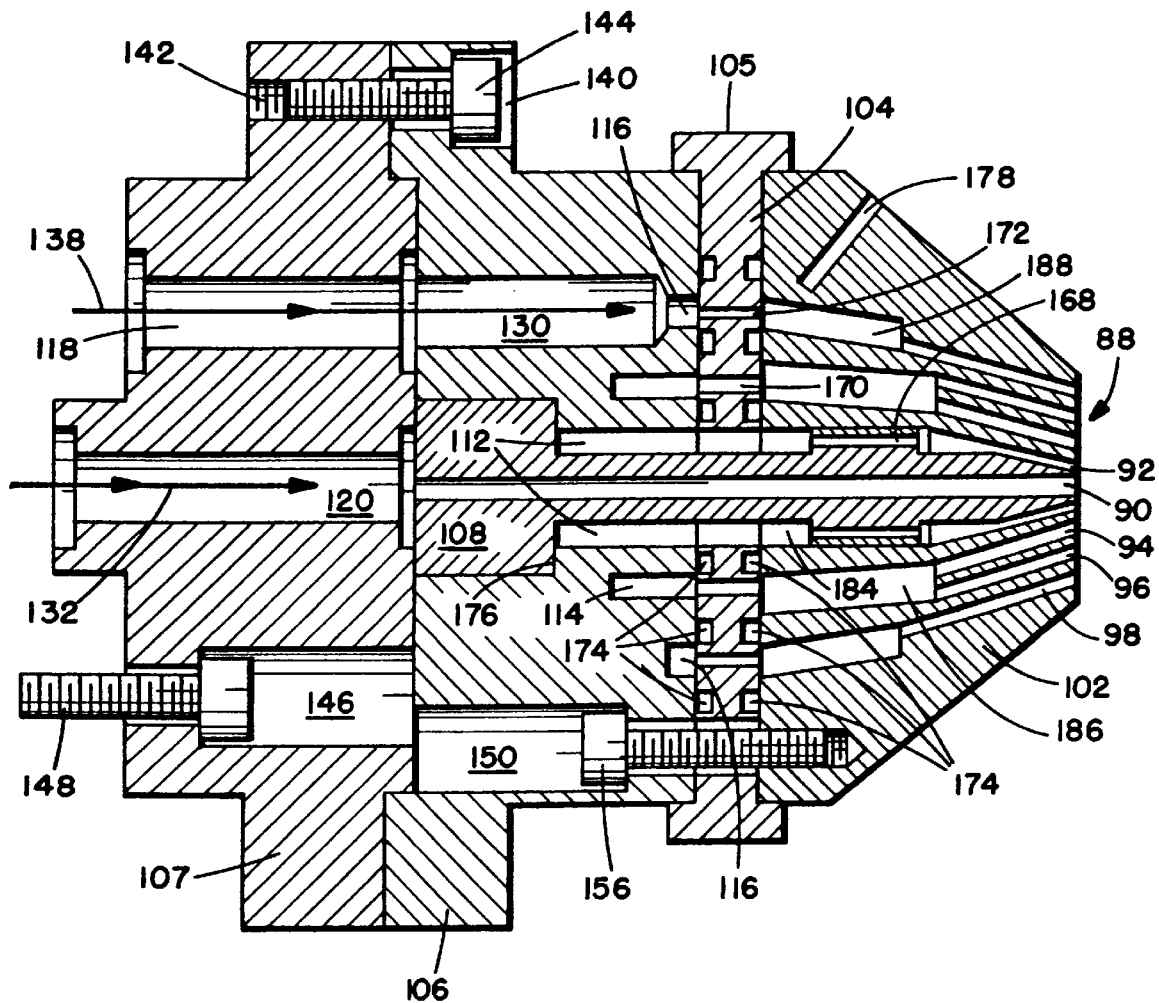
FIG. 6 is a cross-sectional view of the precision burner of the invention along lines 6—6 in FIG. 5.
Figure 7:
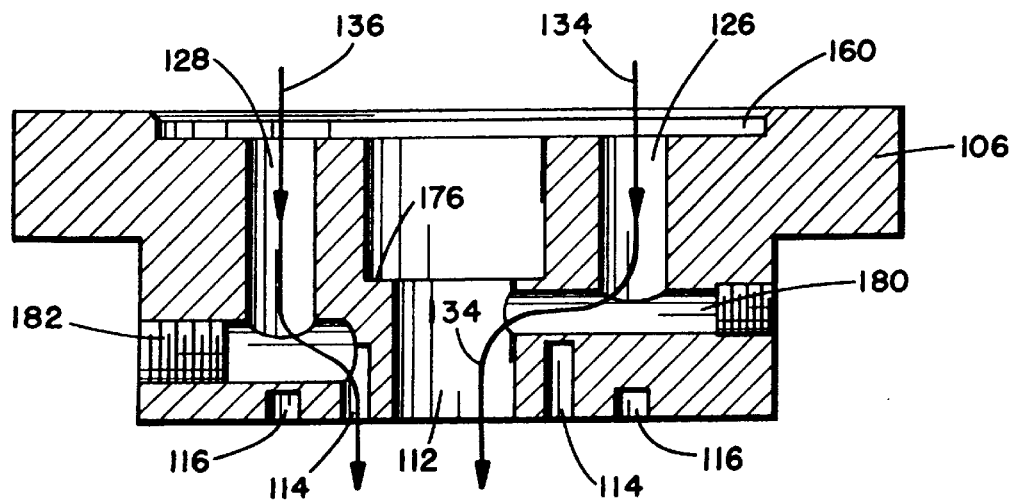
FIG. 7 is a cross-sectional view along lines 7—7 in FIG. 5 of the back block component of the precision burner of the invention.

FIGS. 5–7 illustrate a preferred burner construction for use with a multi-burner, gas-supplying manifold. In particular, burner 100 shown in these figures can be assembled and mounted on a gas-supplying manifold with a high degree of precision. The burner is thus particularly well-suited for use in OVD systems wherein multiple burners are employed in the production of preforms, with each burner depositing soot on only a portion of the preform.

Although particularly advantageous for such multi-burner applications, precision burner 100 can be used in single burner applications, if desired. Similarly, although the preferred application of the burner is in the oxidation of halide-free, silicon-containing raw materials, the burner can also be used with halide-containing materials. In such a case, a gas flow pattern like that of Table 1 and a burner face configuration like that of FIG. 3 will normally be used. For the purposes of the following discussion, it is assumed that the burner is used with halide-free, silicon-containing raw materials and thus has the gas flow pattern and burner face configuration of FIG. 4.

Precision burner 100 has five main components: face block 102, manifold plate 104, back block 106, fume tube 108, and burner mounting block 107.

In use, face block 102, manifold plate 104, back block 106, and fume tube 108 are assembled as described below to form subassembly 13, burner mounting block 107 is mounted on a gas-supplying manifold (not shown) by means of bolts 148 which pass through unthreaded bolt holes 146 in burner mounting block 107 and engage corresponding threaded bolt holes in the gas-supplying manifold, and then subassembly 13 is mounted on burner mounting block 107 by means of bolts 144 which pass through unthreaded bolt holes 140 in back block 106 and engage threaded bolt holes 142 in burner mounting block 107. The use of bolts 148 to mount burner block 107 on the gas-supplying manifold, as opposed to flange 32 of prior art burner 10, provides improved repeatability in the mounting of an individual burner and reduced inter-burner variability in the mounting of a series of burners.

Precision mounting of subassembly 13 on burner mounting block 107 is achieved by means of (1) alignment stud 158 which is carried by burner mounting block 107 and engages an aperture (not shown) in the back of back block 106, and (2) raised face 162 of burner mounting block 107 which is received in recess 160 of back block 106 (see FIG. 7). Raised face 162 and recess 160 are preferably machined into their respective blocks to insure a precision fit, e.g., these features are formed by turning of the blocks. These blocks, as well as face block 102 and manifold plate 104 are preferably made of aluminum, which can be readily machined. Fume tube 108 is preferably made of stainless steel, e.g., 303 stainless steel. Other materials can, of course, be used for these components, if desired.

O-rings 166, only one of which is shown in FIG. 5, are used to seal gas receiving apertures 118 through 124 in burner mounting block 107 to their corresponding gas passages in back block 106. At their rearward ends, gas receiving apertures 118 through 124 mate with gas supply lines and gas tight fittings (not shown) provided by the gas-supplying manifold. In terms of the gas flow pattern of FIG. 4, gas receiving aperture 118 receives $CH_4+O_2$ premix, gas receiving aperture 120 receives OMCTS+fume $O_2$, gas receiving aperture 122 receives innershield N and gas receiving aperture 124 receives outershield $O_2$.

The gas flows through the burner are schematically illustrated by arrows 132 through 138, where arrow 132 represents the flow of OMCTS+fume $O_2$, arrow 134 represents the flow of innershield $N_2$, arrow 136 represents the flow of outershield $O_2$, and arrow 138 represents the flow of $CH_4+O_2$ premix. As can be seen in the figures, large gas passages are used in all parts of the burner up to the burner face to reduce the differences in pressure drops between burners.

As indicated by arrow 132, OMCTS+fume $O_2$ enters burner mounting block 107 through gas receiving aperture 120, proceeds through fume tube 108, and ultimately exits the burner's face through region 90. Fume tube 108 has a single diameter bored hole 90 for uniform pressure drop and is press fit into back block 106 until it reaches shoulder 176. In this way, a precision alignment is achieved between the fume tube and the back block. Burner face block 102 has a slide fit over fume tube 108 which provides alignment, as well as easy disassembly, of these components. The bored hole 90 of fume tube 108 preferably has a diameter of, for example, 2.2 mm.

Orifices 168, which serve to equalize the pressure of the innershield gas, are formed as an integral part of fume tube 108. They thus form integral inner shield manifold 110 (see FIG. 5). This is an important feature of precision burner 100 since it eliminates removable inner shield manifold 20 which was a source of substantial burner-to-burner variability for prior art burner 10.

Innershield $N_2$ enters burner mounting block 107 through gas receiving aperture 122 (FIG. 5), proceeds through gas passage 126 in back block 106 and into central aperture 112 of that block (see arrow 134 in FIG. 7), passes through integral inner shield manifold 110, and ultimately exits the burner's face through region 92. As shown in FIG. 7, passage 180 proceeds radially through back block 106 and serves to connect passage 126 with central aperture 112. Passage 180 is sealed at its outer end by a Lee® plug.

Outershield $O_2$ enters burner mounting block 107 through gas receiving aperture 124 (FIG. 5), proceeds through gas passage 128 in back block 106 and into inner annulus 114 of that block (see arrow 136 in FIG. 7), passes through pressure equalizing orifices 170 of manifold plate 104, and ultimately exits the burner's face through regions 94 and 96. As shown in FIG. 7, passage 182 proceeds radially through back block 106 and serves to connect passage 128 with inner annulus 114. Passage 182 is sealed at its outer end by a Lee® plug.

The $CH_4+O_2$ premix enters burner mounting block 107 through gas receiving aperture 118 (FIG. 6), proceeds through gas passage 130 in back block 106 and into outer annulus 116 of that block (see arrow 138 in FIG. 6), passes through pressure equalizing orifices 172 of manifold plate 104, and ultimately exits the burner's face through region 98.

Subassembly 13 is assembled by press fitting fume tube 108 into central aperture 112 of back block 106, inserting O-rings 164 into grooves 174 of manifold plate 104, passing the manifold plate over the leading end of the fume tube and aligning bolt holes 152 in the plate with bolt holes 150 in the back block, and passing face block 102 over the leading end of the fume tube and aligning its bolt holes 154 with bolt holes 152. Bolts 156, only one of which is shown in FIG. 5, are then inserted through aligned bolt holes 150, 152, and 154, and tightened to hold burner subassembly 13 together. The tightening of bolts 156 bring O-rings 164 of manifold plate 104 into engagement with back block 106 and face block 102, thus preventing gas leakage between the various passages of the burner. If desired, a thermocouple may then be mounted in bore 178 in face block 102 (FIG. 6).

The press fitting of fume tube 108 into back block 106 has been found to result in substantially less burner-to-burner variability than that seen with the threaded approach for attaching the fume tube used in prior art burner 10. Also, the rear portion of fume tube 108 comprises a central bore meeting a flat surface. The rear portion of fume tube 18 of prior art burner 10, on the other hand, had a large bore for receiving a gas fitting which tapered down to a smaller bore for carrying fume gases to the burner's face. In practice, it was found that the tapered area varied from piece-to-piece, leading to an overall increase in burner-to-burner variability.

Manifold plate 104 includes flange 105 which serves the important function of accurately aligning face block 102 and back block 106 with one another and with the manifold plate. The burner-to-burner variability seen in prior art burner 10 is substantially reduced through the use of this flanged plate.

Although preferred and other embodiments of the invention have been described herein, further embodiments may be perceived by those skilled in the art without departing from the scope of the invention as defined by the following claims.

What is claimed is:

1. A silicon dioxide containing soot-producing burner comprising:
   (a) a burner subassembly which comprises:
      a back block having a plurality of gas-carrying passages,
      a face block having a central gas-carrying passage and a plurality of gas-carrying passages surrounding the central gas-carrying passage,
      a manifold plate between the back block and the face block, said manifold plate comprising a plurality of orifices for providing equalization of a pressure of gas flowing through the plurality of gas-carrying passages surrounding the central gas-carrying passage of the face block, and;
   (b) a burner mounting block which comprises a first burner mounting block bolt and a first burner mounting block bolt hole for attachment of said burner mounting block to a gas-supplying manifold; wherein said burner subassembly is mounted on the burner mounting block.

2. The silicon dioxide containing soot-producing burner of claim 1 wherein said first burner mounting block bolt engages a corresponding threaded bolt hole in the gas-supplying manifold.

3. The silicon dioxide containing soot-producing burner of claim 1 wherein said burner subassembly comprises a first burner subassembly bolt and a first burner subassembly bolt hole wherein said first burner subassembly bolt passes through said first burner subassembly bolt hole and engages a corresponding threaded second bolt hole in the burner mounting block.

4. The silicon dioxide containing soot-producing burner of claim 1 wherein said first burner mounting block bolt hole is unthreaded.

5. The silicon dioxide containing soot-producing burner of claim 1 wherein the face block comprises a burner face having first, second, third, and fourth gas-emitting regions, the second region surrounding the first region, the third region surrounding the second region, and the fourth region surrounding the third region, the third gas-emitting region comprises an inner gas-emitting subregion and an outer gas-emitting subregion, the outer gas-emitting subregion of the third gas-emitting region surrounds the inner gas-emitting subregion of the third gas-emitting region, wherein each of (i) the inner gas-emitting subregion, (ii) the outer gas-emitting subregion, and (iii) the fourth gas-emitting region comprises a ring of orifices, said rings having diameters $D_i$, $D_o$, and $D_4$, respectively, with $D_i<D_o<D_4$ with a difference between $D_4$ and $D_o$ being greater than a difference between $D_0$ and $D_i$.

6. A silicon dioxide containing soot producing apparatus, for utilization of halide-free, silicon-containing materials, comprising a burner, said burner having a burner face comprised of:
   an oxygen and halide-free, silicon-containing material gas-emitting region comprised of a center orifice;
   an inert gas gas-emitting region, said inert gas gas-emitting region surrounding said oxygen and halide-free, silicon-containing material gas-emitting region and comprised of a second orifice;
   an oxygen gas-emitting region, said oxygen gas-emitting region surrounding said inert gas gas-emitting region, said oxygen gas-emitting region comprised of a plurality of orifices which define an inner ring having a diameter $D_i$ and an outer ring having a diameter $D_o$; and
   an oxygen and combustible gas gas-emitting region, said oxygen and combustible gas gas-emitting region surrounding said oxygen gas-emitting region, said oxygen and combustible gas gas-emitting region comprised of a plurality of orifices which define a ring having a diameter $D_4$, with $D_i<D_o<D_4$ wherein $D_4-D_o$ is greater than $D_o-D_i$, wherein said orifices which define said inner ring and said outer ring of said oxygen gas-emitting region have a diameter greater than a diameter of the orifices which define the ring of diameter $D_4$ of said oxygen and combustible gas gas-emitting region.

7. A silicon containing soot-producing apparatus as claimed in claim 6 wherein said apparatus further comprises an oxygen and halide-free, silicon-containing material delivery system comprised of an $O_2$ gas source and an octamethylcyclotetrasiloxane (OMCTS) vaporizer, wherein said oxygen and halide-free, silicon-containing material delivery system is connected with said center orifice of said halide-free, silicon-containing material gas-emitting region.

8. A silicon dioxide containing soot-producing apparatus as claimed in claim 6 wherein said apparatus further comprises an oxygen and combustible gas delivery system comprised of a premix $O_2$ gas source and a premix $CH_4$ gas source, wherein said oxygen and combustible gas delivery system is connected with said orifices of said oxygen and combustible gas-emitting region.

9. A silicon dioxide containing soot-producing burner for a gas-supplying manifold comprising:
   (a) a burner subassembly which comprises:
      a back block having a plurality of gas-carrying passages,
      a face block having a central gas-carrying passage and a plurality of gas-carrying passages surrounding the central gas-carrying passage,
      a manifold plate between the back block and the face block, and;
   (b) a burner mounting block which comprises a first burner mounting block bolt and a first burner mounting block bolt hole for attachment of said burner mounting block to said gas-supplying manifold; wherein said first burner mounting block bolt passes through said first burner mounting block bolt hole and engages a corresponding threaded bolt hole in the gas-supplying manifold, said burner subassembly mounted on the burner mounting block, said burner subassembly comprises a first burner subassembly bolt and a first burner subassembly bolt hole wherein said first burner subassembly bolt passes through said first burner subassembly bolt hole and engages a corresponding threaded second burner mounting block bolt hole in the burner mounting block.

\* \* \* \* \*

UNITED STATES PATENT AND TRADEMARK OFFICE
CERTIFICATE OF CORRECTION

PATENT NO. : 5,922,100
DATED : July 13, 1999
INVENTOR(S) : Michael B. Cain
Robert B. Desorcie
William J. Kiefer
Dale R. Powers It is certified that error appears in the above-identified patent and that said Letters Patent is hereby corrected as shown below:

| Col. | Line | Description |
|---|---|---|
|  |  | Front page, under Inventors, change "Desorice" to "Desorcie" |
| 1 | 51 | Change "polymethylcyciosiloxanes" to "polymethylcyclosiloxanes" |

Signed and Sealed this

Fifteenth Day of May, 2001

Attest:

NICHOLAS P. GODICI

*Attesting Officer*   *Acting Director of the United States Patent and Trademark Office*